(12) United States Patent
Shepard et al.

(10) Patent No.: US 9,490,426 B2
(45) Date of Patent: Nov. 8, 2016

(54) MULTIPLE BIT PER CELL DUAL-ALLOY GST MEMORY ELEMENTS

(71) Applicant: HGST, Inc., San Jose, CA (US)

(72) Inventors: Daniel R. Shepard, North Hampton, NH (US); Mac D. Apodaca, San Jose, CA (US)

(73) Assignee: HGST, Inc., San Jose, CA (US)

( * ) Notice: Subject to any disclaimer, the term of this patent is extended or adjusted under 35 U.S.C. 154(b) by 24 days.

(21) Appl. No.: 14/561,679

(22) Filed: Dec. 5, 2014

(65) Prior Publication Data

US 2016/0012889 A1 Jan. 14, 2016

Related U.S. Application Data

(60) Provisional application No. 62/022,289, filed on Jul. 9, 2014.

(51) Int. Cl.
*H01L 45/00* (2006.01)
*G11C 13/00* (2006.01)
*H01L 27/24* (2006.01)

(52) U.S. Cl.
CPC ....... *H01L 45/1253* (2013.01); *G11C 13/0004* (2013.01); *G11C 13/0069* (2013.01); *H01L 27/2409* (2013.01); *H01L 27/2427* (2013.01); *H01L 45/06* (2013.01); *H01L 45/124* (2013.01); *H01L 45/1246* (2013.01); *H01L 45/144* (2013.01); *H01L 45/1675* (2013.01); *G11C 2013/0078* (2013.01)

(58) Field of Classification Search
CPC .......... G11C 13/0069; G11C 13/0004; H01L 45/1253; H01L 27/2409
USPC ........................................................... 365/163
See application file for complete search history.

(56) References Cited

U.S. PATENT DOCUMENTS

| | | | | |
|---|---|---|---|---|
| 2006/0077741 A1* | 4/2006 | Wang | ...................... | G11C 11/56 365/222 |
| 2013/0292631 A1* | 11/2013 | Chin | ...................... | H01L 45/06 257/4 |
| 2014/0326942 A1* | 11/2014 | Oh | ...................... | H01L 45/04 257/4 |

* cited by examiner

*Primary Examiner* — Richard Elms
*Assistant Examiner* — Xiaochun L Chen
(74) *Attorney, Agent, or Firm* — Patterson & Sheridan, LLP

(57) ABSTRACT

In various embodiments, a memory cell for storing two or more bits of information includes two series-connected memory storage elements composed of programmable materials having different melting points, enabling independent programming of the storage elements via different current pulses.

11 Claims, 7 Drawing Sheets

MULTIPLE BIT PER CELL DUAL-ALLOY GST MEMORY ELEMENTS

RELATED APPLICATION

This application claims the benefit of and priority to U.S. Provisional Patent Application No. 62/022,289, filed Jul. 9, 2014, the entire disclosure of which is hereby incorporated herein by reference.

TECHNICAL FIELD

In various embodiments, the present invention relates to the structure and operation of memory cells, and more particularly to memory cells being used to store more than one binary bit per memory cell.

BACKGROUND

Conventional high-capacity memory devices have been enabled by the fabrication of highly dense arrays of conductors and other memory components. In the case of memory devices, higher-capacity storage requires finer conductors and spacing between the conductors, which is typically enabled via photolithographic techniques. As the demand for higher capacity in memory devices increases, however, the need to form even finer features arises.

In an effort to reduce the cost and increase the capacity of memory devices, techniques for storing more than one binary bit in a single memory cell have been developed. The multiple bits are stored as intermediate levels within the cell. In the case of a flash memory cell, a range of voltages may be stored to represent the multiple bit states. In the case of a phase-change memory, a range of resistances may be stored to represent the multiple bit states. Similarly, capacitive memories can store a range of capacitance values. Most types of memory cell may be adapted to store multiple memory states by storing intermediate levels as appropriate for the particular storage cell technology, as known to those of skill in the art. However, one of the problems with multi-bit memory cells is that the range of levels corresponding to the various states may suffer from spreading and ultimately of overlapping levels, which can result in data loss.

In view of the foregoing, there is a need for a memory cell capable of storing two or more discrete bits of data but that enjoys the stability of a single-bit memory cell. Embodiments of the present invention fill this need by stacking two physical memory elements in a single cross-point array bit location, where each of the two stacked elements is set or reset to store information, thereby avoiding the condition where an intermediate level could drift to an adjacent state. Further embodiments allow for intermediate levels to be stored for even more bits stored at a given memory cell location.

SUMMARY

Embodiments of the present invention enable the construction of a memory element capable of storing two or more bits of information. Embodiments also enable the construction of a memory element that includes two or more elements, one of which may optionally be a threshold switch, and one or more of which may store one or more bit of information). Thus, embodiments of the present invention include any two terminal storage element formed in series with a switch element in a cross-point array, such as a diode or a threshold switch. Various embodiments of the invention also take advantage of the ability of a resistance-change material (e.g., a phase-change material) to be altered electrically to cause heating to change the element's resistance and store one of a plurality of states. Suitable phase-change materials include chalcogenides, in which the programmed resistivity may be one of two resistance values and, in the case of more than one bit per cell storage cells, in which the programmed resistivity may be one of three or more resistance values. One such chalcogenide is germanium-antimony-tellurium material (GST).

In accordance with various embodiments of the present invention, two or more memory elements are constructed in series (i.e., within a particular memory cell at a memory cell location, e.g., within an array of memory cells). Each memory element in the series of memory elements typically has a maximum current level (which may translate into a temperature due to resistive heating of the cell caused by the current) above which the state of that memory element is undefined and a minimum current (lower than the maximum current) below which the state of that memory element is fixed. When the current is above the greatest maximum current of all of the memory elements in the series of memory elements, the states of all of the memory elements in the series of memory elements are undefined (or "reset"). When the current is below the lowest minimum current of any of the memory elements in the series of memory elements, the states of all of the memory elements in the series of memory elements are fixed (or "set"). Between the maximum current and minimum current of any given memory element (i.e., the programming current range for that given memory element), the state of that memory element is changing and, in particular, when the current transitions from a current that is greater than the maximum current to a current that is less than the minimum current for a given memory element, the state of that memory element is being written; the resulting state of that memory element following that transition is a function of the specific characteristics of the current transition itself. Generally speaking, the programming current ranges of all of the memory elements in the series of memory elements are non-overlapping (a slight overlap is allowable). As a result, if the current is initially raised above the greatest maximum current of all of the memory elements in the series of memory elements (thereby putting all of the memory elements in an undefined state) and the current then is lowered to a current that is below the lowest minimum current of any of the memory elements in the series of memory elements, each of the memory elements in the series of memory elements will be written as the current transitions through the programming current range for that particular memory element. The specific characteristics of the current (e.g., ramp rate) as it transitions through the programming current range of each particular memory element determine the state of each individual memory element, respectively. For example, phase change material memory elements (e.g., chalcogenide alloys) will typically be written into different states for different rates of change of the current while passing through the programming current range; a very fast transition (such as an abrupt transition occurring in a few nanoseconds or less) will result in the corresponding memory element taking on an amorphous state having a high resistance whereas a slower transition (such as a transition taking 500 to 1000 nanoseconds and having a nearly constant rate of current change) will result in the corresponding memory element taking on a more crystalline state having a significantly lower resistance.

In an aspect, embodiments of the invention feature a method of programming a memory cell comprising (i) a first storage element comprising a first programmable material having a first melting point, and (ii) in series with the first storage element, a second storage element comprising a second programmable material having a second melting point less than the first melting point. Any or all of first, second, third, or fourth current pulses may be applied to the memory cell. The first current pulse may be applied to the memory cell to reset both the first and second storage elements. The first current pulse includes or consists essentially of (i) a first maximum current for heating the first and second storage elements above the first melting point, and (ii) a first trailing edge portion decreasing from the first maximum current sufficiently rapidly to quench each of the first and second programmable materials in a first bit state. The second current pulse may be applied to the memory cell to set both the first and second storage elements. The second current pulse includes or consists essentially of (i) a second maximum current for heating the first and second storage elements above the first melting point, and (ii) a second trailing edge portion decreasing from the second maximum current sufficiently slowly to anneal each of the first and second programmable materials in a second bit state different from the first bit state. The third current pulse may be applied to the memory cell to set the first storage element and reset the second storage element. The third current pulse includes or consists essentially of (i) a third maximum current for heating the first and second storage elements above the first melting point, (ii) a third trailing edge portion decreasing from the third maximum current to a first intermediate current sufficiently slowly to anneal the first programmable material in the second bit state, the second programmable material remaining substantially melted thereduring, and (iii) a fourth trailing edge portion decreasing from the first intermediate current sufficiently rapidly to quench the second programmable material in the first bit state. The fourth current pulse may be applied to the memory cell to reset the first storage element and set the second storage element. The fourth current pulse includes or consists essentially of (i) a fourth maximum current for heating the first and second storage elements above the first melting point, (ii) a fifth trailing edge portion decreasing from the fourth maximum current to a second intermediate current sufficiently rapidly to quench the first programmable material in the first bit state, the second programmable material remaining substantially melted thereduring, and (iii) a sixth trailing edge portion decreasing from the second intermediate current sufficiently slowly to anneal the second programmable material in the second bit state.

Embodiments of the invention may include one or more of the following in any of a variety of different combinations. The first bit state may correspond to a substantially amorphous microstructure. The second bit state may correspond to a substantially crystalline microstructure. Each of the first and second programmable materials may include or consist essentially of a chalcogenide material. The first and second programmable materials may include or consist essentially of the same material, and the geometries (e.g., cross-sectional areas) of the first and second storage elements may be different, such that the same current across both elements results in a different temperature in each element. The first and second programmable materials may include or consist essentially of different materials, and the geometries of the first and second storage elements may be substantially the same.

In another aspect, embodiments of the invention feature a memory cell including or consisting essentially of (i) a first storage element including or consisting essentially of a first programmable material having a first melting point, and (ii) in series with the first storage element, a second storage element including or consisting essentially of a second programmable material having a second melting point less than the first melting point. The memory cell is programmable via application of any or all of first, second, third, or fourth current pulses. The first current pulse may be applied to the memory cell to reset both the first and second storage elements. The first current pulse includes or consists essentially of (i) a first maximum current for heating the first and second storage elements above the first melting point, and (ii) a first trailing edge portion decreasing from the first maximum current sufficiently rapidly to quench each of the first and second programmable materials in a first bit state. The second current pulse may be applied to the memory cell to set both the first and second storage elements. The second current pulse includes or consists essentially of (i) a second maximum current for heating the first and second storage elements above the first melting point, and (ii) a second trailing edge portion decreasing from the second maximum current sufficiently slowly to anneal each of the first and second programmable materials in a second bit state different from the first bit state. The third current pulse may be applied to the memory cell to set the first storage element and reset the second storage element. The third current pulse includes or consists essentially of (i) a third maximum current for heating the first and second storage elements above the first melting point, (ii) a third trailing edge portion decreasing from the third maximum current to a first intermediate current sufficiently slowly to anneal the first programmable material in the second bit state, the second programmable material remaining substantially melted thereduring, and (iii) a fourth trailing edge portion decreasing from the first intermediate current sufficiently rapidly to quench the second programmable material in the first bit state. The fourth current pulse may be applied to the memory cell to reset the first storage element and set the second storage element. The fourth current pulse includes or consists essentially of (i) a fourth maximum current for heating the first and second storage elements above the first melting point, (ii) a fifth trailing edge portion decreasing from the fourth maximum current to a second intermediate current sufficiently rapidly to quench the first programmable material in the first bit state, the second programmable material remaining substantially melted thereduring, and (iii) a sixth trailing edge portion decreasing from the second intermediate current sufficiently slowly to anneal the second programmable material in the second bit state.

Embodiments of the invention may include one or more of the following in any of a variety of different combinations. The first bit state may correspond to a substantially amorphous microstructure. The second bit state may correspond to a substantially crystalline microstructure. Each of the first and second programmable materials may include or consist essentially of a chalcogenide material. The first and second programmable materials may include or consist essentially of the same material, and the geometries (e.g., cross-sectional areas) of the first and second storage elements may be different, such that the same current across both elements results in a different temperature in each element. The first and second programmable materials may include or consist essentially of different materials, and the geometries of the first and second storage elements may be substantially the same. The first storage element may be disposed above the second storage element. A selection device for selecting the memory cell (e.g., a diode) may be disposed below the second storage element. A third storage element may be connected in series with the first and second storage elements (e.g., at the same memory-cell location). The third storage element may include or consist essentially of a third programmable material having a third melting point different from the first and/or second melting points.

The first, second, third, and fourth maximum currents may be the same, or any of them may be different from the others, as long as the current level is sufficient to reprogram both of the first and second storage elements (e.g., by melting the material thereof). The first and second intermediate currents may be the same, or they may be different from each other, as long as the current level is (a) sufficiently high that the second programmable material (and thus the second storage element) remains unprogrammed (e.g., melted), and (b) sufficiently low that the first programmable material (and thus the first storage element) remains programmed (e.g., unmelted) below the temperature, its state being defined by the speed at which the current (and thus, in various embodiments, the temperature) in the first storage element changed when decreasing to the temperature. As used herein, a temperature or current change (e.g., a trailing edge of a current pulse) that is "sufficiently rapid" to quench a programmable material into a first bit state is rapid enough to "lock in" the melted or amorphous microstructure of the material by not allowing the atoms of the material sufficient time to realign in a crystalline state. A temperature or current change (e.g., a trailing edge portion of a current pulse) that is "sufficiently slow" to anneal a programmable material into a second bit state is slow enough to allow such atomic realignment from a melted or amorphous state into a crystalline state. As known to those of skill in the art, the requisite speed of such current and/or temperature changes is dependent at least in part on, e.g., the geometry of the storage element and the melting point (and even other materials-specific properties) of a particular programmable material. Nevertheless, the rates of such current and/or temperature changes may be determined without undue experimentation by, for example, a series of controlled current and/or temperature applications to a particular storage element followed by measurements of the resulting electrical resistance exhibited by the programmable material upon cooling. Materials characterization (e.g., x-ray diffraction analysis) may even be performed to determine the degree of crystallinity of a programmable material after such a current/temperature cycle.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Different memory element materials (R-RAM, PRAM, memristors, etc.) may be set and reset using different levels of current or voltage, and, within a particular type of memory element material, different chemical compositions will typically require different levels of current or voltage for the set and reset operations. For example, a phase-change memory element made of a chalcogenide material such as GST-172 (i.e., a chalcogenide alloy of germanium, antimony and tellurium in approximately the ratio of 1 to 7 to 2, respectively) may require a current for setting and resetting that is five to ten times greater than that required to set and reset a different chalcogenide material such as GST-433 (i.e., a chalcogenide alloy of germanium, antimony and tellurium in approximately the ratio of 4 to 3 to 3, respectively). Embodiments of the present invention advantageously exploit such differences in operating current.

Figure 1:
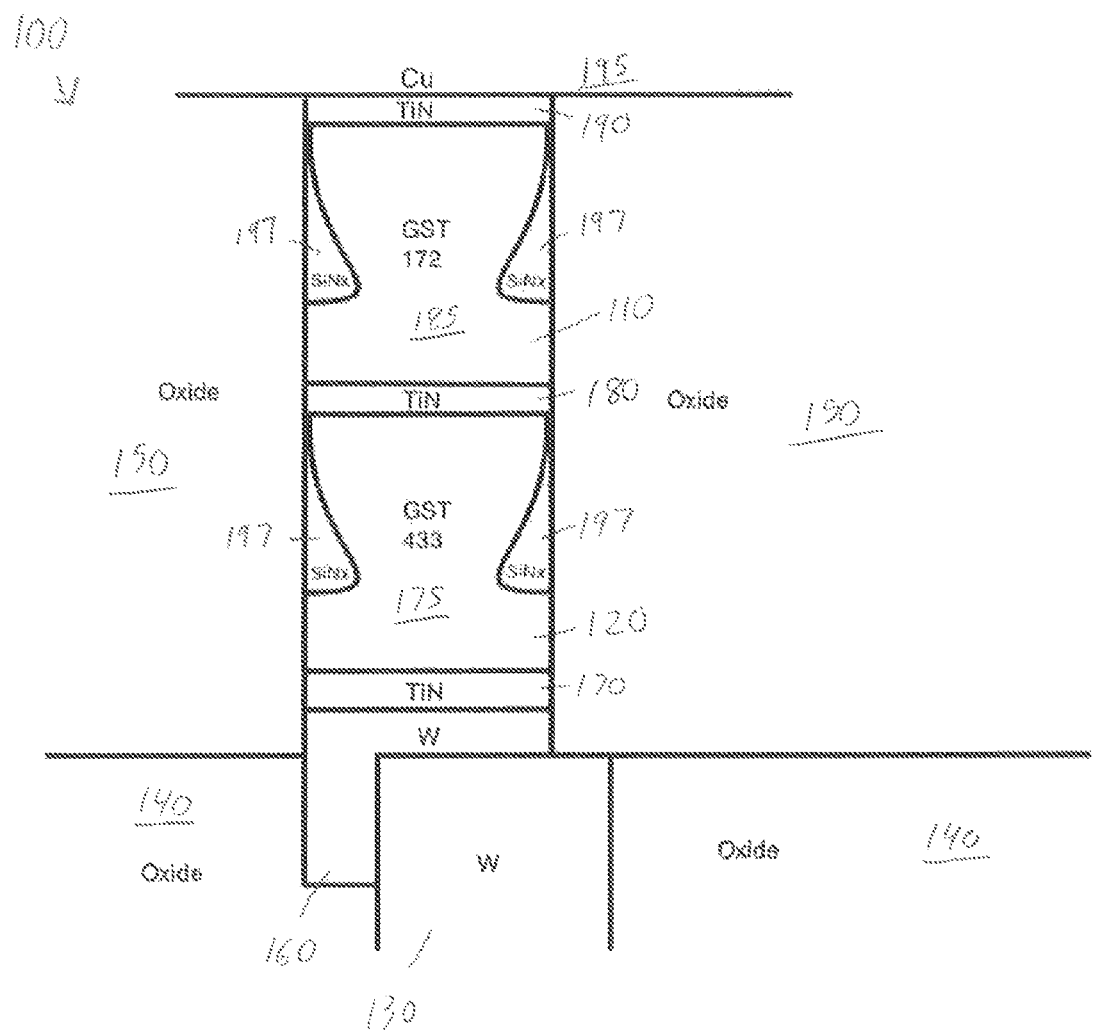
FIG. 1 is a schematic cross-section of a dual-bit memory element in accordance with various embodiments of the invention.

Embodiments of the present invention feature the stacking of two or more physical memory elements in a single cross-point array bit location, where each of the two stacked elements is independently set or reset to store information, thus avoiding the condition where an intermediate level might drift to an adjacent memory state. FIG. 1 depicts a memory cell 100 fabricated according to embodiments of the present invention, in which different materials are utilized in each physical memory element. In the exemplary embodiment of memory cell depicted in FIG. 1, two phase-change memory elements 110, 120 are used to build the cell. For example, memory element 110 may include or consist essentially of a first chalcogenide material (such as GST-172), and memory element 120 may include or consist essentially of a second chalcogenide material having a operating current and/or a composition different from that of the memory element 110.

As shown in FIG. 1, the memory cell 100 is constructed on a surface or substrate in which a cross-point array of diode select devices 130 in a field of an insulating material 140 (which may include or consist essentially of, e.g., an oxide such as silicon dioxide) has already been constructed. The diode select devices 130 prevent "current sneak paths," as is well known to those skilled in the art of cross-point memory arrays. (Alternatively, a threshold switch such as an ovonic threshold switch (OTS) device may be incorporated with the stacked memory elements in lieu of a diode select device 130.) As shown, the diode select devices 130 each have a top contact including or consisting essentially of a conductive material such as tungsten (W). Above the top contact, a layer of a dielectric 150 (such as an oxide (e.g., silicon dioxide) or a nitride (such as silicon nitride)) is deposited, and openings are etched such that there is one hole on top of every memory cell aligned to the diode 130 top contact. Some misalignment (as is depicted in FIG. 1 as the imperfect registration between the diode 130 top contact and the bottom contact of the memory elements thereabove) is permissible. In various embodiments of the invention, the openings in dielectric 150 are first filled with conductive material 160 (e.g., W) and then etched back so as to leave a small amount in the bottom of the hole to facilitate a good electrical to the top contact of the diode 130, particularly when the hole is slightly misaligned to the diode 130 (as depicted in FIG. 1). This approach has the additional advantage when fabricating a cross-point array that the diodes in the cross-point array are identical to any diodes formed in the periphery, thereby potentially eliminating any photo mask used to differentiate between diodes in the periphery and diodes having a stacked memory element. In embodiments of the invention utilizing an OTS device, the diode is omitted but the conductive material remains.

Once the holes are filled with the bottom conductor 160 to create a good electrical contact with the diode 130 top contact, a layer of barrier and/or adhesion material 170 (such as Ti or TiN) may be deposited and etched back (as was done to form the bottom conductor 160 for a good electrical contact) to leave a small layer over the bottom conductor 160. This deposition and etch back sequence is repeated to fill the hole with a bottom memory-cell material 175 (e.g., a first chalcogenide material such as GST-433), an intra-element barrier material 180 (such as TiN), a top memory-cell material 185 (e.g., a second chalcogenide material such as GST 172), and a top contact 190 (such as TiN). The top contact 190 may alternately be formed by deposition and finished with a CMP step instead of an etch. From this point, a top dielectric layer may be deposited and then metal wordlines 195 formed by, for example, a copper damascene process, may be fabricated to complete the memory array. The cell 100 depicted in FIG. 1 also includes optional narrowing spacers 197 in the centers of the memory elements 110,120, and these spacers 197 may be formed as detailed in U.S. Pat. No. 8,766,227, issued on Jul. 1, 2014, the entire disclosure of which is incorporated by reference herein.

In accordance with embodiments of the present invention, separately programming the memory elements 110,120 is accomplished by taking advantage of the different currents required to melt or anneal the two memory elements due to the difference in melting temperatures of the two elements' materials 175,185. For example, a memory element 110 having a 50 nm diameter and a narrowing to about 20 nm at the neck due to a narrowing spacer (as shown in FIG. 1) may require a pulse of current of at least 500 µA to 800 µA with a fast trailing edge for a reset operation. The fast trailing edge is generally required to quench the heating quickly enough to trap the material (e.g., a phase-change material such as a chalcogenide) in a higher resistance, amorphous state. Setting a memory element 110 including or consisting essentially of GST-172 may be accomplished by ramping the trailing edge over an interval of about 500 nanoseconds (ns). The slow switching off of the current results in a slow reduction of heat in the cell, which anneals the memory-cell material into a lower resistance, crystalline state. This set pulse trailing edge ramp may be truncated once the amplitude reaches 10% to 20% of the initial amplitude because at this point, the annealing will typically be mostly completed. On the other hand, a similarly sized memory element including or consisting essentially of GST-433 may require a pulse of current of 90 µA with a fast trailing edge for a reset operation or a slow trailing edge for a set operation.

Figure 7:
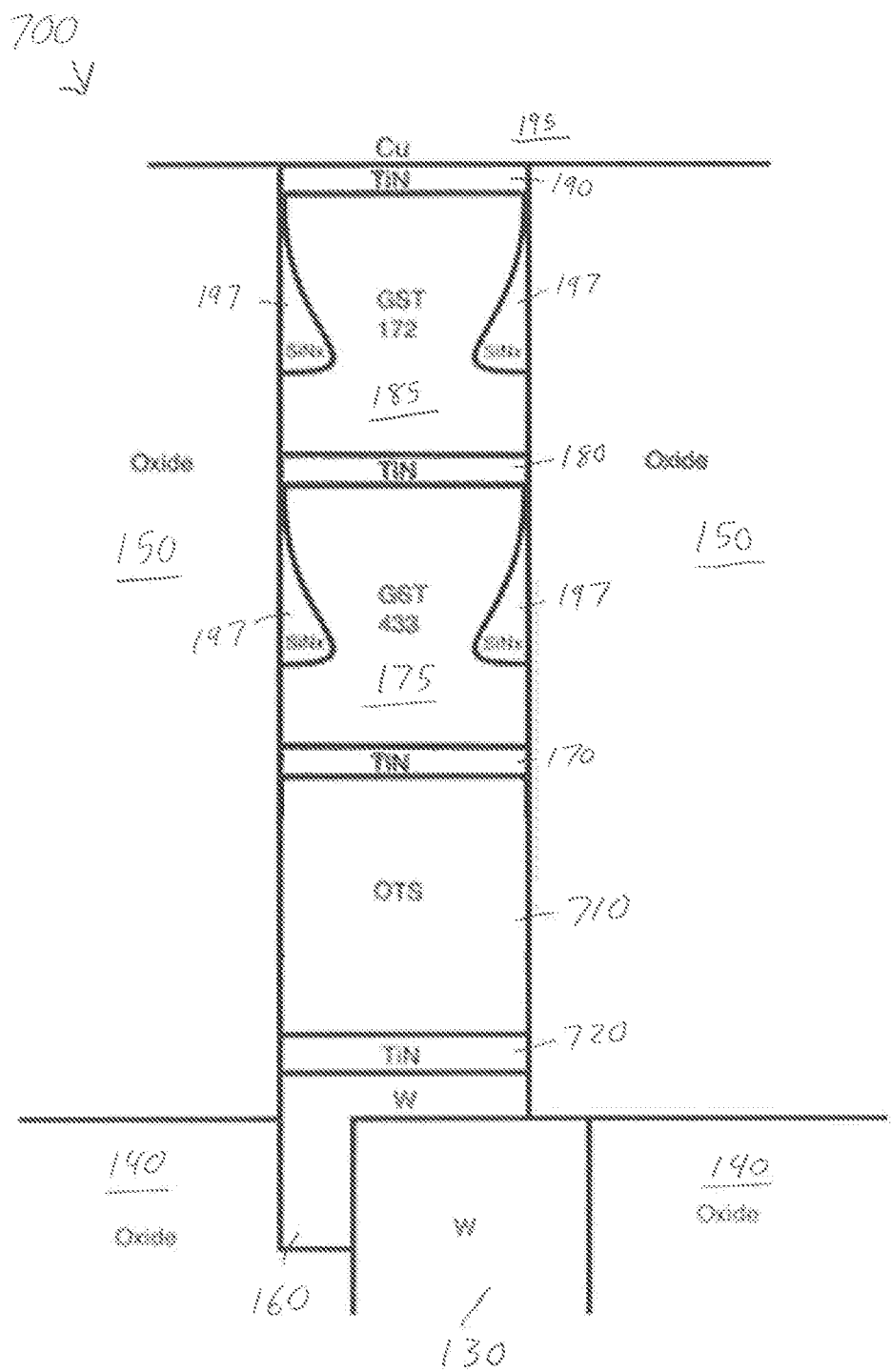
FIG. 7 is a schematic cross-section of a three-element memory cell in accordance with various embodiments of the invention.

Other materials and pore sizes may be used in embodiments of the present invention. In general, for two or more memory elements in series, a current will be passed through all of the cells to effect melting of all of the cells (by passing a current that is selected for the cell with the highest melting temperature—the "top cell"). Melting the top cell will melt all cells substantially simultaneously. As the current is reduced, the top cell will drop below its melting point and, as the current is further reduced, this cell will attain its crystallization point. In various embodiments, a second cell of these cells in series will have a melting point that is below the crystallization point of the top cell (however, some overlap of the temperature ranges is possible). When the current is reduced to the point of reaching the melting point of this second cell, the top cell will (mostly) be done changing state and its resistance will be set. These temperature points will typically be determined by the alloys of the cell materials employed; however, they may also be determined by the geometry of the cells (e.g., one cell might have a much narrower pore opening (i.e., diameter or other lateral dimension) than the other, resulting in a higher current density; this will enable two cells that are made of the same material to melt and crystallize at different temperatures with the narrower pore cell melting and crystallizing at lower currents than the cell with the wider pore). A combination of different alloys and varying pore sizes may also be utilized. Furthermore, a threshold switch device OTS may be incorporated with the stacked memory elements, thereby eliminating the need for a diode select device for blocking sneak current paths. FIG. 7 depicts an exemplary memory cell 700 incorporating a three-element stack in which the bottom element 710 is an OTS device but could, alternatively, be a third programmable memory cell material (e.g., a GST alloy), with or without a narrowing spacer. A bottom barrier 720 (e.g., TiN) may be disposed between the bottom element 710 and the bottom contact 160.

Once the current is reduced to the point near or below the crystallization point of the top cell, that top cell is removed from the programming function. As such, the bottom cell may actually be two cells in series, whereby one of these two cells functions as the new top cell and the other as the new second cell. This may be repeated for as many cells (as determined by their combinations of different alloys and varying pore sizes) as may be found having mostly non-overlapping melting to crystallizing temperature ranges.

Figure 2:
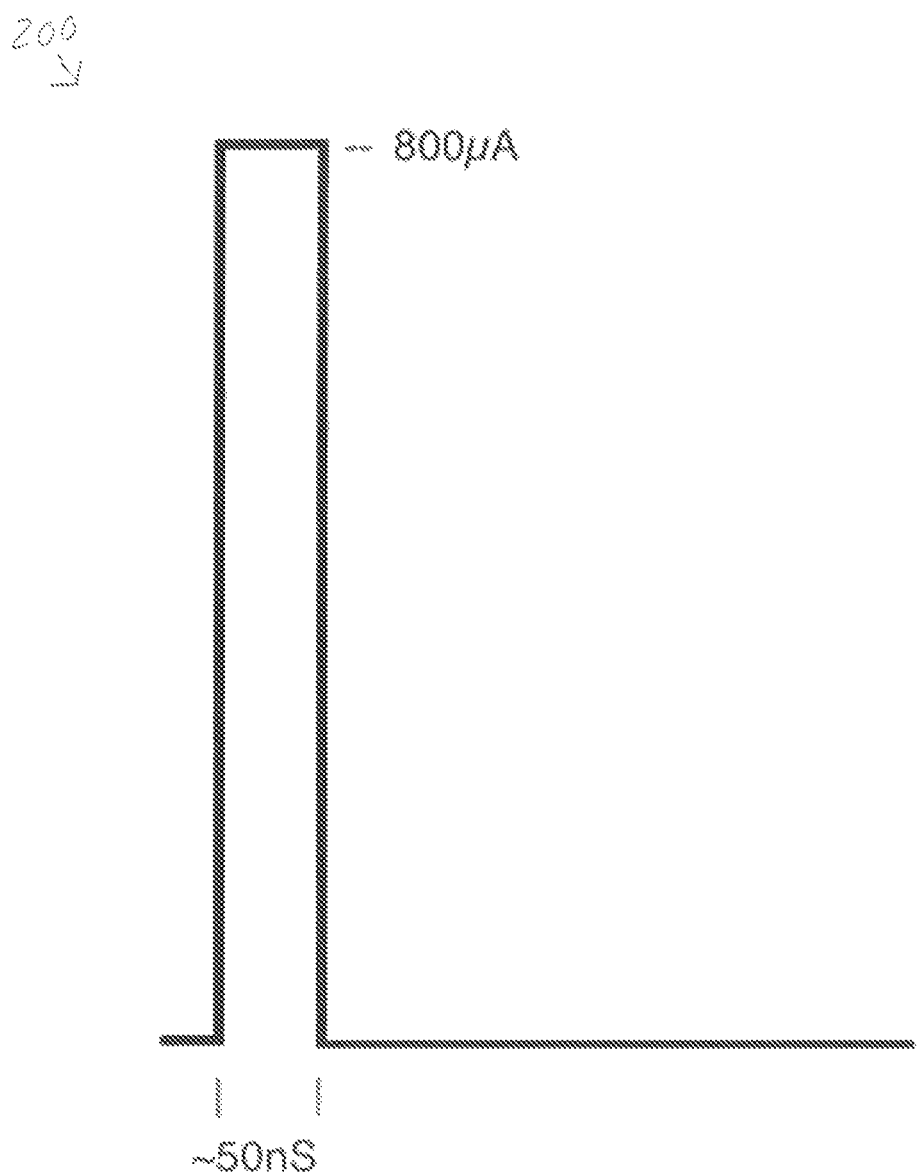
FIG. 2 is a plot of current as a function of time for resetting both bits of a dual-bit memory element in accordance with various embodiments of the invention.

FIG. 2 depicts an exemplary current pulse 200 for resetting both bits of a dual-bit memory element according to embodiments of the present invention. The high amplitude (e.g., between 500 µA and 800 µA) results in a memory cell temperature sufficient to melt the material of both storage elements 110, 120, and the rapid cutoff quenches both bits into their amorphous states.

Figure 3:
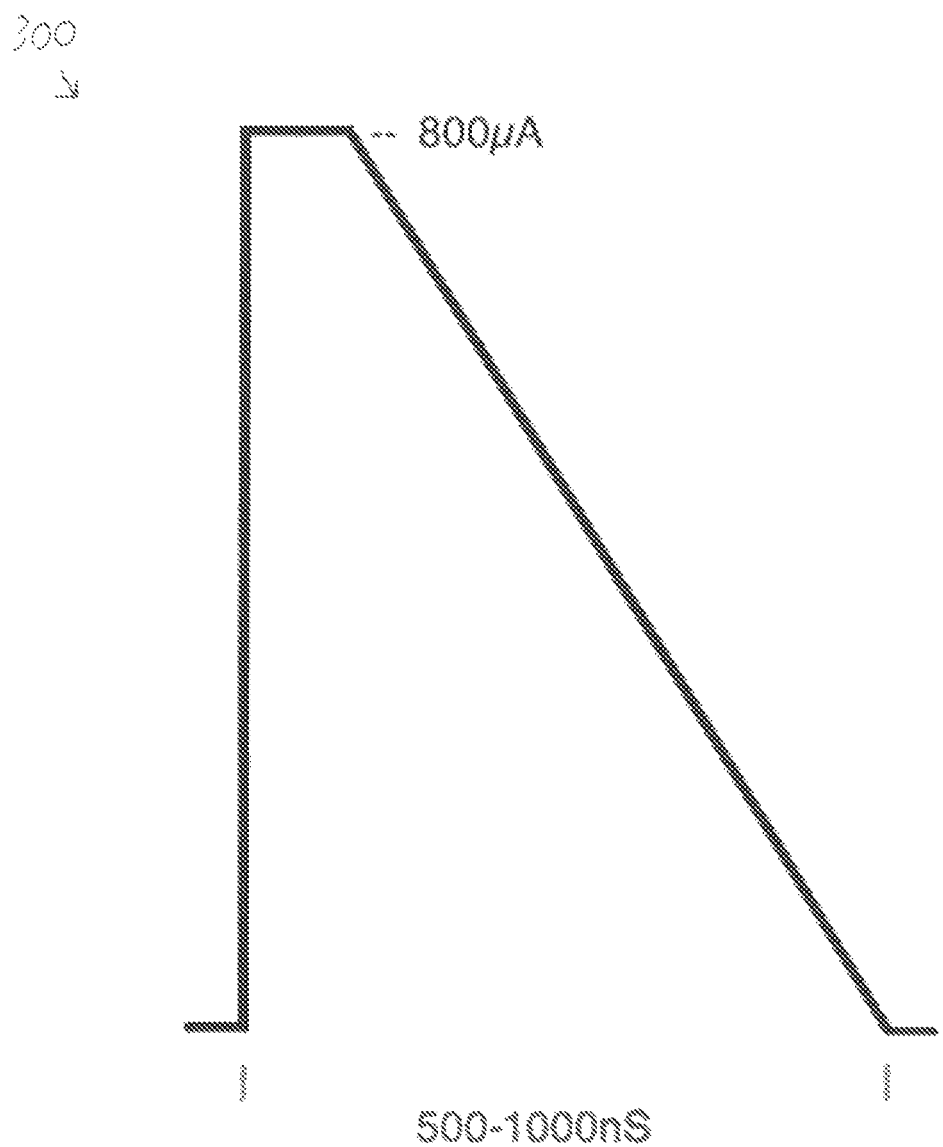
FIG. 3 is a plot of current as a function of time for setting both bits of a dual-bit memory element in accordance with various embodiments of the invention.

FIG. 3 depicts an exemplary current pulse 300 for setting both bits of a dual-bit memory element according to embodiments of the present invention. The high amplitude (e.g., between 500 μA and 800 μA) will melt the material of both storage elements 110, 120. The slow ramping trailing edge will cause the upper element 110 (which may include or consist essentially of, e.g., GST-172) to be annealed into its crystalline state as the amplitude ramps through the approximately 100 μA level, whereas the lower element 120 (which may include or consist essentially of, e.g., GST-433) will still be in its melted state. As the ramp continues downward through 90 μA and down to 0 μA, the lower element 120 will then also be annealed into its crystalline state.

Figure 4:
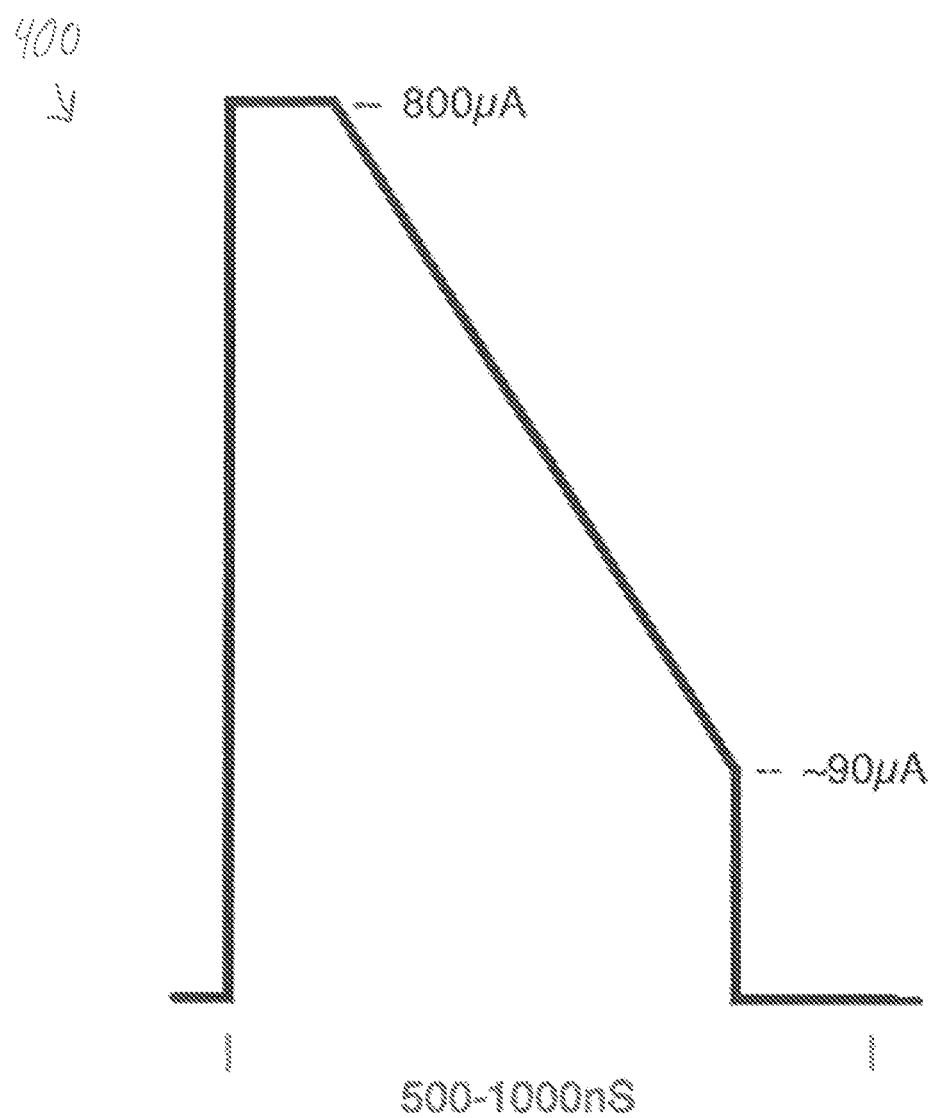
FIG. 4 is a plot of current as a function of time for setting the upper bit and resetting the lower bit of a dual-bit memory element in accordance with various embodiments of the invention.

FIG. 4 depicts an exemplary current pulse 400 for setting the upper bit 110 and resetting the lower bit 120 of a dual-bit memory element according to embodiments of the present invention. The high initial amplitude (e.g., between 500 μA and 800 μA) will melt both storage elements 110, 120. The slow ramping trailing edge will cause the upper element 110 (which may include or consist essentially of, e.g., GST-172) to be annealed into its crystalline state as the amplitude ramps through the approximately 100 μA level, whereas the lower element 120 (which may include or consist essentially of, e.g., GST-433) will still be in its melted state. However, from this point, the current is quickly quenched and this rapid cutoff will quench the bottom bit 120 into its amorphous state.

Figure 5:
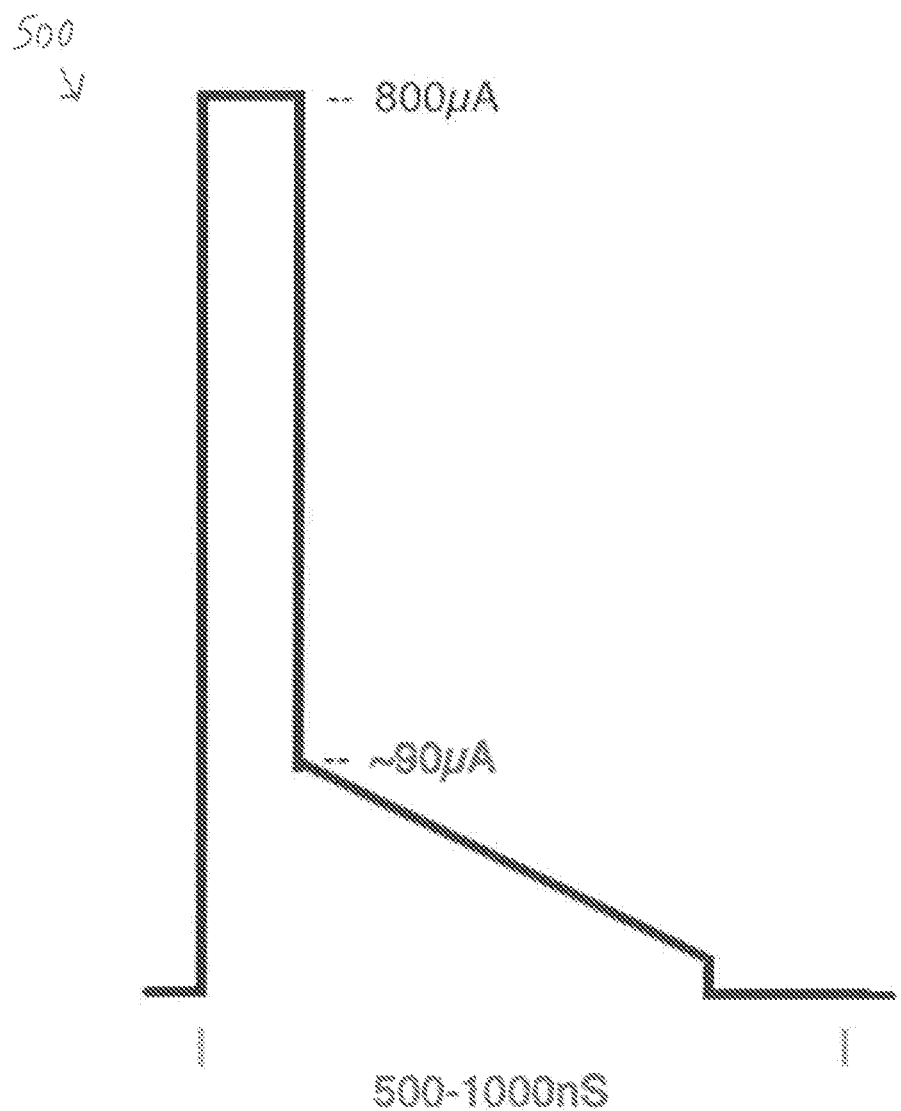
FIG. 5 is a plot of current as a function of time for resetting the upper bit and setting the lower bit of a dual-bit memory element in accordance with various embodiments of the invention.

FIG. 5 depicts an exemplary current pulse 500 for resetting the upper bit 110 and setting the lower bit 120 of a dual-bit memory element according to embodiments of the present invention. The high initial amplitude (e.g., between 500 μA and 800 μA) will melt both storage elements 110, 120. The rapidly dropping trailing edge will cause the upper element 110 (which may include or consist essentially of, e.g., GST-172) to be trapped in its amorphous state (as the pulse drops quickly to 10% to 20% of the initial value) while the lower element 120 will still be in its melted state. However, from this point, as the ramp continues downward from 90 μA and down to 0 μA, the lower element 120 will then be annealed into its crystalline state.

Memory cells having been programmed with more than a single binary bit may exhibit a typical failure mode by taking on the level of an adjacent state. This may occur because the level being stored is not stored to exactly the correct value. This may result from temperature variations, voltage fluctuations, poor circuit design or many other causes while programming. This may also result after correctly programming a cell due to the physics of the storage element; for example, phase-change storage elements tend to drift towards becoming less crystalline over time (because the atomic structure of the phase-change material spontaneously evolves towards thermodynamic equilibrium, which is the state of maximum entropy). Charged floating gates such as those in flash memory cells, even if initially programmed correctly, will occasionally lose an electron from the floating gate and, consequently, may drift in the direction of the fully discharged state. One solution to this problem is to program fewer levels in a given storage element. For example, a single middle level may be added to a cell otherwise only having a set and a reset state. Such an approach combined with the techniques described herein would result in a memory cell having three bits of storage. The programming of a middle level may be accomplished by altering the point at which the trailing edge transitions from a slow ramp to a final fast quench. Referring to FIG. 4, if the current were quickly reduced to about 100 μA from the point in the middle of the ramping portion, the upper element would be partially annealed (i.e., to an intermediate level) while the lower bit would still be in its melted state. The bottom bit may then be likewise placed into an intermediate state by quenching the current from near the middle of its current ramp (as depicted in FIG. 5).

Reading of the memory cell is accomplished by applying a low voltage (typically less than 0.4 volts) and reading the current through the cell to determine the combined series resistance of the two elements. For example, a lower element 120 made of GST-433 may have a set resistance in the vicinity of 40 KΩ, whereas it could have a reset resistance of about 1 MΩ. An upper element 110 made of GST-172 may have a set resistance in the vicinity of 200 KΩ, whereas it may have a reset resistance of about 2 MΩ (to insure this different range of resistances, either element's length through the neck of the cell's hourglass shaped spacer may be increased or reduced to achieve a discernable difference in resistance values between the two elements). In this example, a resistance of 3 MΩ would correspond to both bits being reset, a resistance of 2.04 MΩ would correspond to the lower bit 120 being set and the upper bit 110 being reset, a resistance of 1.2 MΩ would correspond to the lower bit 120 being reset and the upper bit 110 being set, and a resistance of 240 KΩ would correspond to both bits being set.

Figure 6:
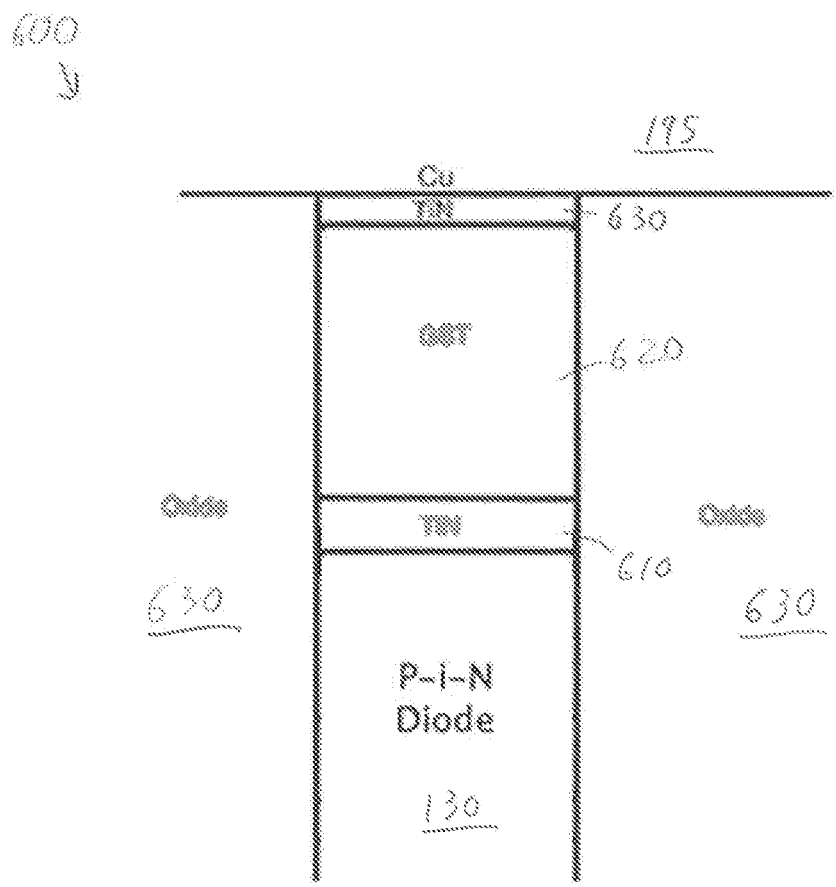
FIG. 6 is a schematic cross-section of a memory cell having a single memory element and a self-aligned bottom contact in accordance with various embodiments of the invention.

The memory elements shown herein in a stacked form within a hole or cup-like opening above the diode 130 whereby the hole is filled with barrier and/or adhesion material (such as Ti or TiN but which could be an alternate material such as TaN) which is deposited into the hole and then etched back (as was done to form the bottom conductor for a good electrical contact); this leaves a small layer of this barrier material in the bottom of the hole which is self-aligned in the structure. A memory element such as GST (but could be other materials or types of information storage elements) is then deposited into the hole above the barrier and/or adhesion material. The structure may include a spacer at the bottom of the hole, the hourglass spacer described above, or no spacer. FIG. 6 depicts a single layer memory cell element 600 in which barrier and/or adhesion material 610 (which may include or consist essentially of, e.g., TiN) has been deposited below the memory element 620 (which may include or consist essentially of a phase-change material such as GST). In practice, the barrier and/or adhesion material 610 may be deposited to fill the hole, and then this barrier and/or adhesion material 610 may be etched back using a timed etch in order to leave a desired amount of the barrier and/or adhesion material 610 in the bottom of the hole. Deposition techniques for filling a high aspect ratio hole are known to those skilled in the art as are etch techniques for selectively removing one material more quickly than another. As an example of an embodiment of the present invention, the surrounding insulating material 630 is $SiO_2$ and the barrier and/or adhesion material 610 to be put at the bottom of the hole is TiN with a titanium salicide (Self-aligned titanium silicide ($TiSi_x$)) layer underneath the TiN. A thin layer of thin Ti (e.g., 6 nm deposited at 680° C.) is deposited first and may be done separately using PVD sputtering at room temp, then CVD TiN (e.g., 64 nm, 680C, precursor is titanium chloride ($TiCl_4$)) which is enough to fill the hole. The deposition temperature is high enough to form the Ti salicide layer. The purpose of this salicide is to provide current spreading on the diode 130. This makes sure the current is spread across the entire diode surface to keep the current density at any one point from becoming too great as will be well understood by those skilled in the art. The TiN has a dual purpose of providing a chemical barrier between the salicide and GST while also being a thermally resistive metal that reduces heat loss to the salicide and silicon diode.

Following the deposition of the barrier and/or adhesion and/or conductive material 610, a titanium nitride etchback is performed by inductively coupled plasma etching using a chlorine-containing etchant gas such as $Cl_2$ with high selectivity to silicon dioxide. The resulting shape is a very short cylinder of TiN in the bottom of the hole without requiring the use of photolithography. Following the etchback of the barrier and/or adhesion and/or conductive material 610, the information storage material 620 (e.g., a chalcogenide alloy such as GST) is deposited and etched back, and following this deposition and etchback of the information storage material 620, a top contact 630 (e.g., a barrier and/or adhesion and/or conductive material such as TiN) may be formed through deposition and, typically, finished with a CMP step (or could be an etchback step).

Memory devices incorporating embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps may be stored, such as GPS devices), and any other digital or digitized information as well as any combinations thereof.

Devices incorporating embodiments of the present invention may be embedded or removable, and may be interchangeable among other devices that can access the data therein. Embodiments of the invention may be packaged in any variety of industry-standard form factor, including compact flash, secure digital, multimedia cards, PCMCIA cards, memory stick, any of a large variety of integrated circuit packages including ball-grid arrays, dual in-line packages (DIPs), SOICs, PLCCs, TQFPs, and the like, as well as in proprietary form factors and custom designed packages. These packages may contain just the memory chip, multiple memory chips, one or more memory chips along with other logic devices or other storage devices such as PLDs, PLA's, micro-controllers, microprocessors, controller chips or chipsets or other custom or standard circuitry.

Systems incorporating memory devices comprising embodiments of the present invention have the advantages of high density, non-volatile memory. Such systems may provide long term storage as a solid state storage device instead of or in addition to rotating media storage (e.g., magnetic disks, read only or read/write optical disks, and the like) and/or network based storage. Such systems may be in the form of a desk-top computer system, a hand-held device (such as a tablet computer or a laptop computer), a communication device (such as a cell phone, a smart phone, a portable wirelessly networked device for music, video or other purposes, or the like), and/or any other system based device having data storage.

While it is a benefit of embodiments of the present invention to provide multiple bits per memory cell whereby each storage element holds a single bit, demands for ever higher storage capacity may result in embodiments of the present invention being operated with more than one bit per storage element. This may be enabled by utilizing a given bit element set to an intermediate level. For example, referring to the upper bit setting in FIG. 4, the slow ramping trailing edge may be rapidly dropped half way through the ramp, causing the upper element 110 to be trapped in an intermediate resistance state. From this point, as the ramp may be slowly dropped downward from 90 μA and down to 0 μA (as depicted in FIG. 5) or rapidly quenched (as depicted in FIG. 4) to program the lower element 120, which will then be annealed into its crystalline or amorphous state, respectively. A similar approach may also be used to program the lower element into an intermediate state.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of programming a memory cell comprising (i) a first storage element comprising a first programmable material having a first melting point, and (ii) in series with the first storage element, a second storage element comprising a second programmable material having a second melting point less than the first melting point, the method comprising:

applying a first current pulse to the memory cell to reset both the first and second storage elements, the first current pulse comprising (i) a first maximum current for heating the first and second storage elements above the first melting point, and (ii) a first trailing edge portion decreasing from the first maximum current sufficiently rapidly to quench each of the first and second programmable materials in a first bit state;

applying a second current pulse to the memory cell to set both the first and second storage elements, the second current pulse comprising (i) a second maximum current for heating the first and second storage elements above the first melting point, and (ii) a second trailing edge portion decreasing from the second maximum current sufficiently slowly to anneal each of the first and second programmable materials in a second bit state different from the first bit state;

applying a third current pulse to the memory cell to set the first storage element and reset the second storage element, the third current pulse comprising (i) a third maximum current for heating the first and second storage elements above the first melting point, (ii) a third trailing edge portion decreasing from the third maximum current to a first intermediate current sufficiently slowly to anneal the first programmable material in the second bit state, the second programmable material remaining substantially melted thereduring, and (iii) a fourth trailing edge portion decreasing from the first intermediate current sufficiently rapidly to quench the second programmable material in the first bit state, wherein the third current pulse has an amplitude that melts both the first and second storage elements; and applying a fourth current pulse to the memory cell to reset the first storage element and set the second storage element, the fourth current pulse comprising (i) a fourth maximum current for heating the first and second storage elements above the first melting point, (ii) a fifth trailing edge portion decreasing from the fourth maximum current to a second intermediate current sufficiently rapidly to quench the first programmable material in the first bit state, the second programmable material remaining substantially melted thereduring, and (iii) a sixth trailing edge portion decreasing from the second intermediate current sufficiently slowly to anneal the second programmable material in the second bit state.

2. The method of claim 1, wherein the first bit state corresponds to a substantially amorphous microstructure.

3. The method of claim 1, wherein the second bit state corresponds to a substantially crystalline microstructure.

4. The method of claim 1, wherein each of the first and second programmable materials comprises a chalcogenide material.

5. A memory cell comprising:
a first storage element comprising a first programmable material having a first melting point; and
in series with the first storage element, a second storage element comprising a second programmable material having a second melting point less than the first melting point,
wherein the memory cell is programmable by:
applying a first current pulse to the memory cell to reset both the first and second storage elements, the first current pulse comprising (i) a first maximum current for heating the first and second storage elements above the first melting point, and (ii) a first trailing edge portion decreasing from the first maximum current sufficiently rapidly to quench each of the first and second programmable materials in a first bit state,
applying a second current pulse to the memory cell to set both the first and second storage elements, the second current pulse comprising (i) a second maximum current for heating the first and second storage elements above the first melting point, and (ii) a second trailing edge portion decreasing from the second maximum current sufficiently slowly to anneal each of the first and second programmable materials in a second bit state different from the first bit state,
applying a third current pulse to the memory cell to set the first storage element and reset the second storage element, the third current pulse comprising (i) a third maximum current for heating the first and second storage elements above the first melting point, (ii) a third trailing edge portion decreasing from the third maximum current to a first intermediate current sufficiently slowly to anneal the first programmable material in the second bit state, the second programmable material remaining substantially melted thereduring, and (iii) a fourth trailing edge portion decreasing from the first intermediate current sufficiently rapidly to quench the second programmable material in the first bit state, wherein the third current pulse has an amplitude that melts both the first and second storage elements, and
applying a fourth current pulse to the memory cell to reset the first storage element and set the second storage element, the fourth current pulse comprising (i) a fourth maximum current for heating the first and second storage elements above the first melting point, (ii) a fifth trailing edge portion decreasing from the fourth maximum current to a second intermediate current sufficiently rapidly to quench the first programmable material in the first bit state, the second programmable material remaining substantially melted thereduring, and (iii) a sixth trailing edge portion decreasing from the second intermediate current sufficiently slowly to anneal the second programmable material in the second bit state.

6. The memory cell of claim 5, wherein the first bit state corresponds to a substantially amorphous microstructure.

7. The memory cell of claim 5, wherein the second bit state corresponds to a substantially crystalline microstructure.

8. The memory cell of claim 5, wherein each of the first and second programmable materials comprises a chalcogenide material.

9. The memory cell of claim 5, wherein the first storage element is disposed above the second storage element, and further comprising, disposed below the second storage element, a selection device for selecting the memory cell.

10. The memory cell of claim 9, wherein the selection device comprises a diode.

11. The memory cell of claim 5, further comprising, connected in series with the first and second storage elements, a third storage element comprising a third programmable material having a third melting point different from at least one of the first or second melting points.

* * * * *